United States Patent
Kim (10) Patent No.: US 12,300,348 B2
(45) Date of Patent: May 13, 2025

(54) METHOD FOR SIGNAL TRANSMISSION, CIRCUIT AND MEMORY

(71) Applicant: CHANGXIN MEMORY TECHNOLOGIES, INC., Hefei (CN)

(72) Inventor: Kiho Kim, Hefei (CN)

(73) Assignee: CHANGXIN MEMORY TECHNOLOGIES, INC., Beijing (CN)

(*) Notice: Subject to any disclaimer, the term of this patent is extended or adjusted under 35 U.S.C. 154(b) by 335 days.

(21) Appl. No.: 17/729,714

(22) Filed: Apr. 26, 2022

(65) Prior Publication Data

US 2022/0383914 A1  Dec. 1, 2022

(30) Foreign Application Priority Data

May 26, 2021  (CN) .......................... 202110579192.6

(51) Int. Cl.
*G11C 7/10* (2006.01)
*G11C 11/4076* (2006.01)
*G11C 11/4096* (2006.01)

(52) U.S. Cl.
CPC ............ *G11C 7/106* (2013.01); *G11C 7/1063* (2013.01); *G11C 11/4076* (2013.01); *G11C 11/4096* (2013.01)

(58) Field of Classification Search
CPC ... G11C 7/106; G11C 7/1063; G11C 11/4076; G11C 11/4096
USPC .......................................................... 702/57
See application file for complete search history.

(56) References Cited

U.S. PATENT DOCUMENTS

| 6,321,366 | B1 | 11/2001 | Tseng | |
|---|---|---|---|---|
| 7,724,606 | B2 | 5/2010 | Osawa | |
| 2009/0026981 | A1* | 1/2009 | Li Volsi | H05B 45/46 315/302 |
| 2014/0062357 | A1* | 3/2014 | Ko | H02P 6/16 318/400.05 |
| 2014/0169094 | A1* | 6/2014 | Kim | G11C 16/26 365/185.12 |
| 2016/0180895 | A1* | 6/2016 | Hong | G11C 7/1066 365/189.05 |
| 2022/0239285 | A1* | 7/2022 | Fan | H03K 19/20 |

FOREIGN PATENT DOCUMENTS

| CN | 102195619 B | | 9/2014 | |
|---|---|---|---|---|
| CN | 112865781 B | * | 4/2022 | ..... H03K 19/017545 |

(Continued)

OTHER PUBLICATIONS

English translation of JP 2009044710, Feb. 26, 2009. (Year: 2009).*

(Continued)

*Primary Examiner* — Michael P Nghiem
(74) *Attorney, Agent, or Firm* — Syncoda LLC; Feng Ma (57) ABSTRACT

A circuit for signal transmission, memory, and method for signal transmission are provided. The circuit includes: a signal processing circuit, configured to receive an input first signal, obtain a second signal by processing the first signal in a preset processing manner, and take the second signal as an output signal of the signal processing circuit; and a selection circuit, configured to receive the input first signal, the second signal and a control signal, and take the first signal or the second signal as an output signal of the selection circuit according to the control signal.

6 Claims, 11 Drawing Sheets

(56) References Cited

FOREIGN PATENT DOCUMENTS

JP            2009044710 A  *   2/2009  ......... H04L 25/4917
KR           100863026 B1  *   10/2008

OTHER PUBLICATIONS

English translation of KR 100863026, Oct. 13, 2008. (Year: 2008).*

* cited by examiner

METHOD FOR SIGNAL TRANSMISSION, CIRCUIT AND MEMORY

CROSS-REFERENCE TO RELATED APPLICATION

This application is based upon and claims the benefit of priority to Chinese Patent Application No. 202110579192.6, filed on May 26, 2021, the contents of which are incorporated herein by reference in their entirety for all purposes.

BACKGROUND

A memory is a device for storing data which is commonly used in an electronic device. Taking a Dynamic Random Access Memory (DRAM) as an example, the DRAM uses the principle of the semiconductor memory to indicate that a binary bit is 1 or 0 by the amount of the electrical charges storied in a capacitor.

In the related art, with the development of the semiconductor process, the operating frequency that can be implemented by the DRAM is getting higher and higher, and there are more and more analog and digital devices in the DRAM itself and the platform on which the DRAM is located, such that the received external signal is susceptible to be interfered by other devices when the DRAM is operating, which in turn causes that the narrow pulse is generated on the received external signal and the accuracy of the subsequent processing for the external signal by the DRAM will be affected.

Therefore, how to eliminate the narrow pulse of the external signal received by the memory is a technical problem to be solved in the art.

SUMMARY

The present disclosure provides a method for signal transmission, a circuit and a memory to implement elimination of narrow pulse of the external signal received by the memory.

A first aspect of the present disclosure provides a circuit for signal transmission. The circuit comprises a signal processing circuit and a selection circuit. The signal processing circuit is configured to receive an input first signal, obtain a second signal by processing the first signal in a preset processing manner, and take the second signal as an output signal of the signal processing circuit. The selection circuit is configured to receive the input first signal, the second signal and a control signal, and take the first signal or the second signal as an output signal of the selection circuit according to the control signal.

A second aspect of the present disclosure provides a memory including the circuit for signal transmission, the circuit comprising: a signal processing circuit, configured to receive an input first signal, obtain a second signal by processing the first signal in a preset processing manner, and take the second signal as an output signal of the signal processing circuit; and a selection circuit, configured to receive the input first signal, the second signal and a control signal, and take the first signal or the second signal as an output signal of the selection circuit according to the control signal.

A third aspect of the present disclosure provides a method for signal transmission. The method can be performed by the circuit for signal transmission provided in the first aspect. The method includes: acquiring a control signal and a first signal; and outputting the first signal according to the control signal, or obtaining a second signal by processing the first signal in a preset processing manner, and outputting the second signal.

BRIEF DESCRIPTION OF THE DRAWINGS

To explain the embodiments of the present disclosure or the technical solutions in the related art more clearly, references will now be made briefly to the accompanying drawings required for the embodiments or the related art. It will be apparent that the accompanying drawings in the following description are only some of the embodiments of the present disclosure, and other drawings may be obtained to those skilled in the art based on these accompanying drawings without involving any inventive efforts.

DETAILED DESCRIPTION

The technical solutions in the embodiments of the present disclosure will be described clearly and completely below with the reference of the accompanying drawings in the embodiments of the present disclosure. It will be apparent that the embodiments described herein are only a part of the embodiments of the present disclosure, rather than all the embodiments of the present disclosure. Based on the embodiments in present disclosure, all other embodiments obtained by those skilled in the art without involving inventive effort shall fall within the scope of the present disclosure.

The terms "first", "second", "third", and "fourth", etc. (if any) in the description and claims of the present disclosure and the above-mentioned accompanying drawings are used to distinguish similar objects, and are not necessarily used to describe a specific sequence or order. It is to be understood that data used in this way may be interchangeable under appropriate cases so that the embodiments of the present disclosure described herein can be implemented, for example, in an order other than those illustrated or described herein. In addition, the terms "include" and "have" as well as any variations thereof are intended to cover non-exclusive inclusions. For example, processes, methods, systems, products, or devices that include a series of steps or units are not necessarily limited to those steps or units clearly listed, but may include other steps or units that are not clearly listed or are inherent to these processes, methods, products, or devices.

Figure 1:
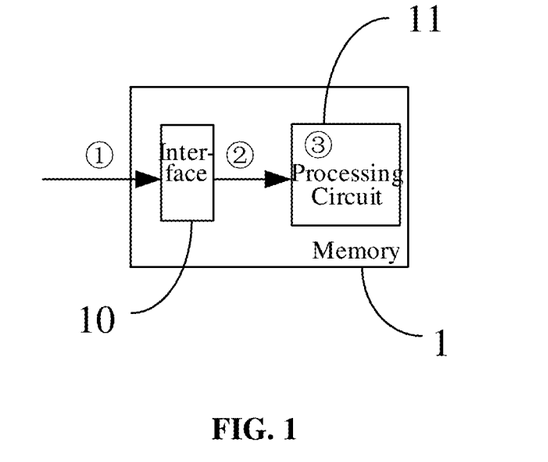
FIG. 1 is a schematic diagram of an application scenario according to the present disclosure.

FIG. 1 is a schematic diagram of an application scenario of the present disclosure. A manner of receiving an external signal by a memory 1 is illustrated as in FIG. 1. Here, an interface 10 built in the memory 1 may be configured to receive an external signal, and transmit the received external signal into the memory 1 to be processed.

In some embodiments, the processing circuit 11 may be a logic circuit having a signal processing capability, or the like. Then the external signal received by the memory 1 may be directly sent to the processing circuit 11 in the memory 1, and the processing circuit 11 performs subsequent processing on the external signal. The specific processing on the external signal performed by the processing circuit 11 is not limited herein.

In some embodiments, the interface 10 may be a physical device (e.g., a chip, a circuit, a logic circuit, etc. for receiving a signal) configured for the memory 1 for receiving the external signal. In some other embodiments, the interface 10 may be a virtual module for depicting FIG. 1. For example, the processing circuit 11 may receive the external signal through one of its pins or a connected wire, and the pin or wire for receiving the external signal may be abstracted as the interface 10 in FIG. 1.

Figure 2:
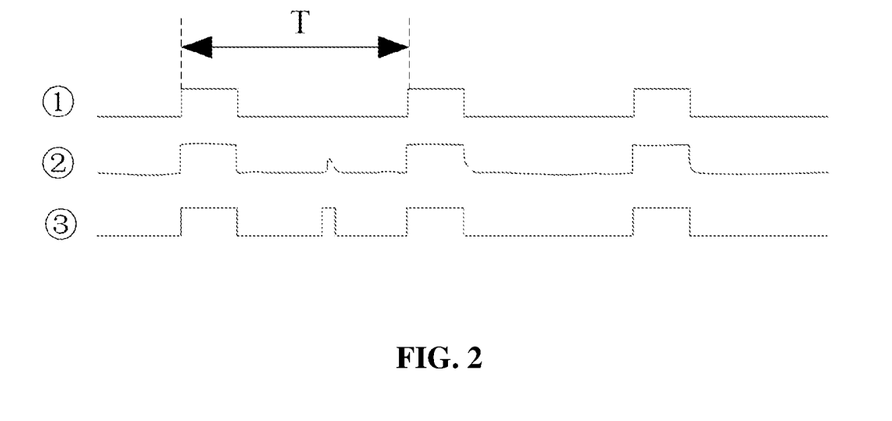
FIG. 2 is a schematic diagram of the waveform of the external signal received by a memory.

FIG. 2 is a schematic diagram of the waveform of an external signal received by a memory. Herein, it is assumed that the memory 1 illustrated in FIG. 1 is receiving the signal ① transmitted from an external device connected to the memory 1. In FIG. 2, taking the signal ① being a standard square wave signal with cycle T as an example, since the signal ① can be understood as a signal actually transmitted by the external device without any change or interference, and is also in a form which is desired to be received by the memory 1, the signal ① can be denoted as a purpose signal. However, during the actual operation of the memory, the received external signal is easily interfered by other devices, which leads to generation of a narrow pulse on the external signal received by the memory. For example, although the external device sends the signal ① to the memory 1 as illustrated in FIG. 1, the external signal actually received by the memory 1 is the signal ② having a waveform with the glitch, such that the signal ③ having a narrow pulse is obtained after that the processing circuit 11 of the memory 1 smooths the signal ②. Thus, the signal that should be processed by the processing circuit 11 is the signal ①, but the signal that actually be processed by the processing circuit 11 is the signal ③ due to the problem of the external signal reception. The narrow pulse in the signal ③ will affect the normal operation of the processing circuit 11 and reduce the accuracy of processing the signal by the processing circuit 11.

Accordingly, the present disclosure further provides a method for signal transmission, a circuit, and a memory for eliminating the narrow pulse of the external signal received by the memory, so that the narrow pulse of the external signal will not affect normal processing on the external signal within the memory and improve the accuracy of processing the signal by the memory.

The technical solutions of the present disclosure will be described in detail with specific embodiments. The following specific embodiments may be combined with each other, and the same or similar concepts or processes may not be elaborated in some embodiments.

Figure 3:
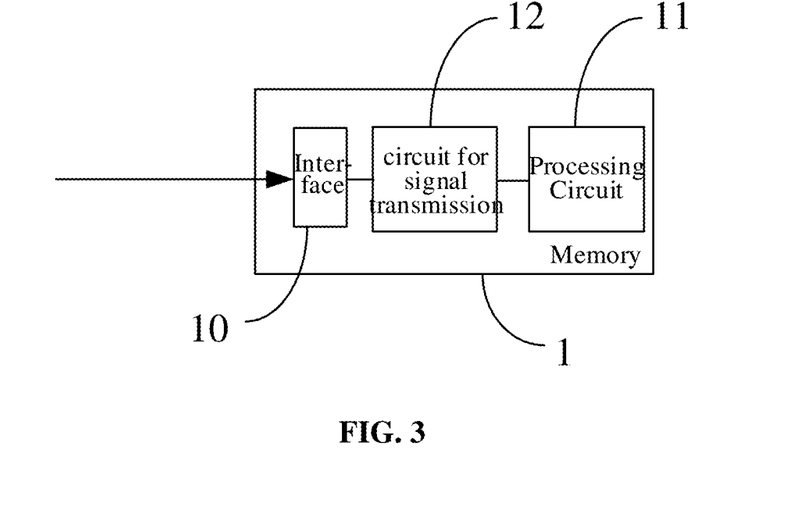
FIG. 3 is a schematic structural diagram of an embodiment of a memory according to the present disclosure.

FIG. 3 is a schematic structural diagram of a memory according to an embodiment of the present disclosure. On the basis of the embodiment as illustrated in FIG. 1, the memory as illustrated in FIG. 3 further includes a circuit 12 for signal transmission between the interface 10 and the processing circuit 11, so that the external signal, which is received by the memory 1 through the interface 10, is processed by the circuit 12 for signal transmission and then sent to the processing circuit 11 inside the memory for subsequent processes.

Figure 4:
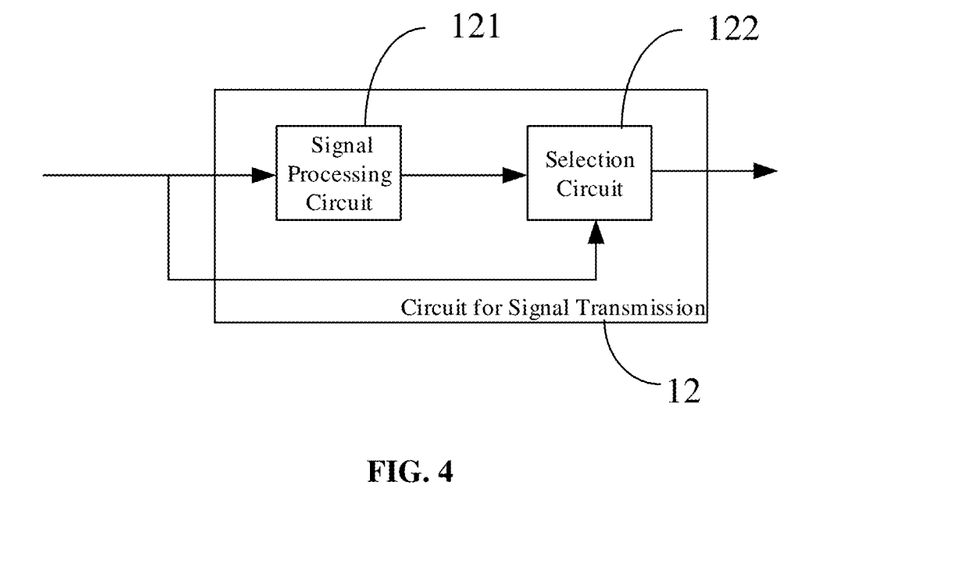
FIG. 4 is a schematic structural diagram of an embodiment of a circuit for signal transmission according to the present disclosure.

FIG. 4 is a schematic structural diagram of an embodiment of a circuit for signal transmission according to the present disclosure. FIG. 4 illustrates a specific implementation of the circuit 12 for signal transmission as illustrated in FIG. 3. The circuit 12 for signal transmission specifically includes a signal processing circuit 121 and a selection circuit 122.

The signal processing circuit 121 is configured to receive an external signal (denoted as a first signal or External Signal, etc.), obtain a second signal (denoted as Internal Signal, or the like) by processing the first signal in a preset processing manner, and output the second signal to the selection circuit 122 as an output signal of the signal processing circuit 121.

Figure 5:
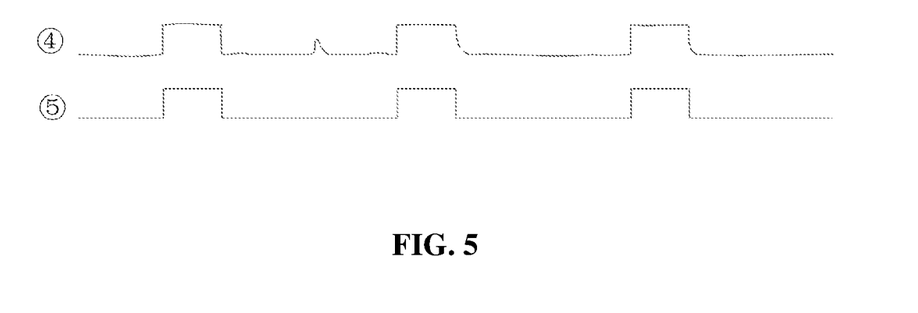
FIG. 5 is a schematic diagram of the waveform of an embodiment of a signal processed by a signal processing circuit according to the present disclosure.

In some embodiments, specifically, the signal processing circuit 121 may be configured to remove a narrow pulse signal between two adjacent pulses in the first signal. This process may also be understood as smoothing the signal between adjacent effective square wave pulse signals in the first signal. For example, FIG. 5 is a schematic diagram of the waveform of a signal processed by a signal processing circuit according to an embodiment of the present disclosure. Herein, the signal processing circuit 121 receives a signal ④ as illustrated in FIG. 5, keeps the first pulse and the second pulse, which are effective pulse signals, in the signal ④ unchanged, and removes the narrow pulse, which is generated due to the transmission glitch, between the first pulse and the second pulse, so that a low level between the first pulse and the second pulse can be kept, thereby obtaining a signal ⑤, and the signal processing circuit 121 outputs the signal ⑤ to the selection circuit 122 as a second signal. As illustrated in FIG. 5, the pulse signal being a high level is taken as an example. Accordingly, it is to be understood that, if the pulse signal of the first signal is the low level, the signal processing circuit 121 can also keep the signal between two active low-level square wave pulses at high level, thereby obtaining the second signal that the narrow pulse has been eliminated.

The selection circuit 122 may be configured to receive a first signal input from the external of the memory and receive a second signal from the signal processing circuit 121. In this case, the selection circuit 122 may select a signal from the first signal and the second signal, that is, the selection circuit 122 may select the first signal or the second signal as an output of the selection circuit 122. In this case, the output signal of the selection circuit 122 is the output signal of the circuit 12 for signal transmission. The selection circuit 122 may select a signal from the first signal and the second signal according to the control signal. The control signal may be sent by the control circuit of the memory. In a specific implementation, the selection circuit 122 may be a data multiplexer (MUX).

Figure 6:
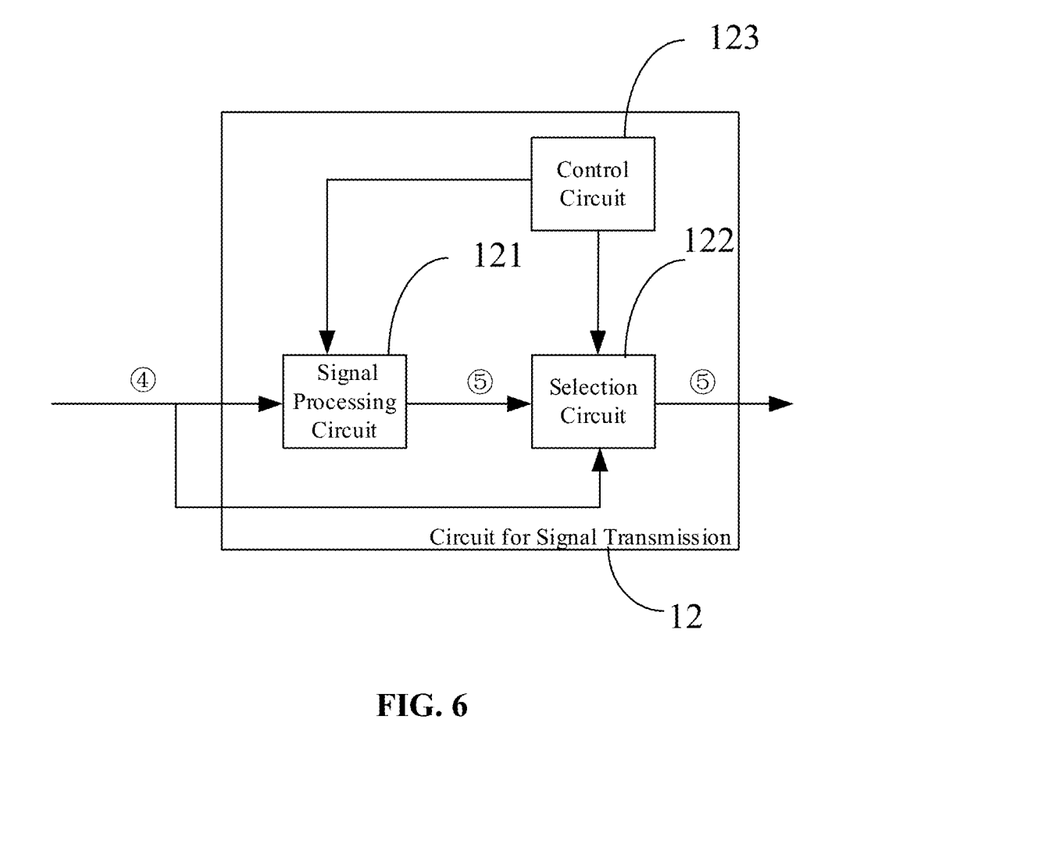
FIG. 6 is a schematic structural diagram of another embodiment of a circuit for signal transmission according to the present disclosure.

In some embodiments, FIG. 6 is a schematic structural diagram of another embodiment of the circuit for signal transmission according to the present disclosure. In an example as illustrated in FIG. 6, the control circuit 123 may be arranged in the circuit 12 for signal transmission to send a control signal (denoted as TM_Block, etc.) to the selection circuit 122, such that the selection circuit 122 outputs the first signal or the second signal according to the control signal. Alternatively, in some other embodiments, the control circuit 123 may be arranged before the circuit 12 for signal transmission, for example, the processing circuit 11 in the memory 1. Alternatively, the control circuit 123 may be another circuit in the memory 1 that can be configured to send a control signal to the selection circuit 122. Alternatively, the control circuit 123 may be a circuit other than the memory 1.

Then, the selection circuit 122 may determine the first signal or the second signal as an output signal according to the received control signal. For example, when the control signal received by the selection circuit 122 corresponds to a first state, the received second signal is output as an output signal. When the control signal received by the selection circuit 122 corresponds to the second state, the received first signal is output as an output signal. Herein, the first state and the second state may be different level states of the control signal. For example, the first state may be that the control signal is high level, and the second state may be that the control signal is low level, etc.

In some embodiments, the signal processing circuit 121 may also receive the control signal and obtains the second signal by processing the first signal in the preset manner only when the control signal corresponds to the first state. When the received control signal corresponds to the second state, since the selection circuit 122 outputs the first signal, the signal processing circuit 121 can output a fixed value as the second signal without processing the first signal, thereby reducing redundancy calculation and energy consumption.

In some embodiments, the control circuit 123 may send the control signal with different states to the selection circuit 122 according to different conditions. For example, when the control circuit 123 determines that a current condition meets a trigger condition, in this condition, it indicates that a narrow pulse may occur in the external signal received by the memory, and then the control circuit 123 sends the control signal with the first state to the selection circuit 122. The control signal with the second state is sent to the selection circuit when the control circuit 123 determines that the current case does not meet the trigger condition and the possibility that a narrow pulse occurs in the external signal is low. In another specific implementation scenario, when the memory is in a test state, the control circuit 123 may send a control signal with the first state to the selection circuit, and when the memory is in a normal operation state, the control circuit sends a control signal with the second state to the selection circuit.

Exemplarily, the circuit 12 for signal transmission illustrated in FIG. 6 receiving the signal ④ illustrated in FIG. 5 is taken as an example. At this case, since the signal ④ has a narrow pulse, the control circuit 123 transmits a control signal with the first state to the selection circuit 122. The signal processing circuit 121 obtains the signal ⑤ according to the signal ④ and inputs the signal ⑤ as a second signal to the selection circuit 122. The selection circuit 122 receives the signal ④ and the signal ⑤ at the same time and take the signal ⑤ as the output signal of the selection circuit.

Figure 7:
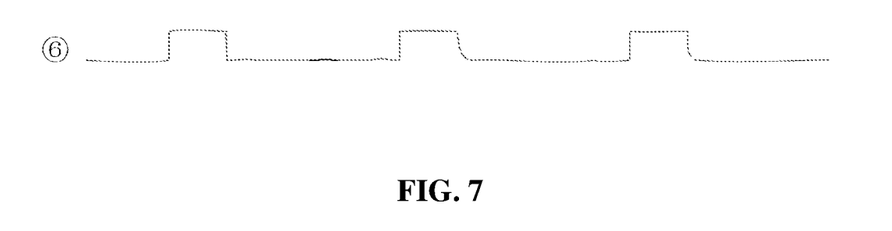
FIG. 7 is a schematic diagram of the waveform of another embodiment of a signal processed by a signal processing circuit according to the present disclosure.
Figure 8:
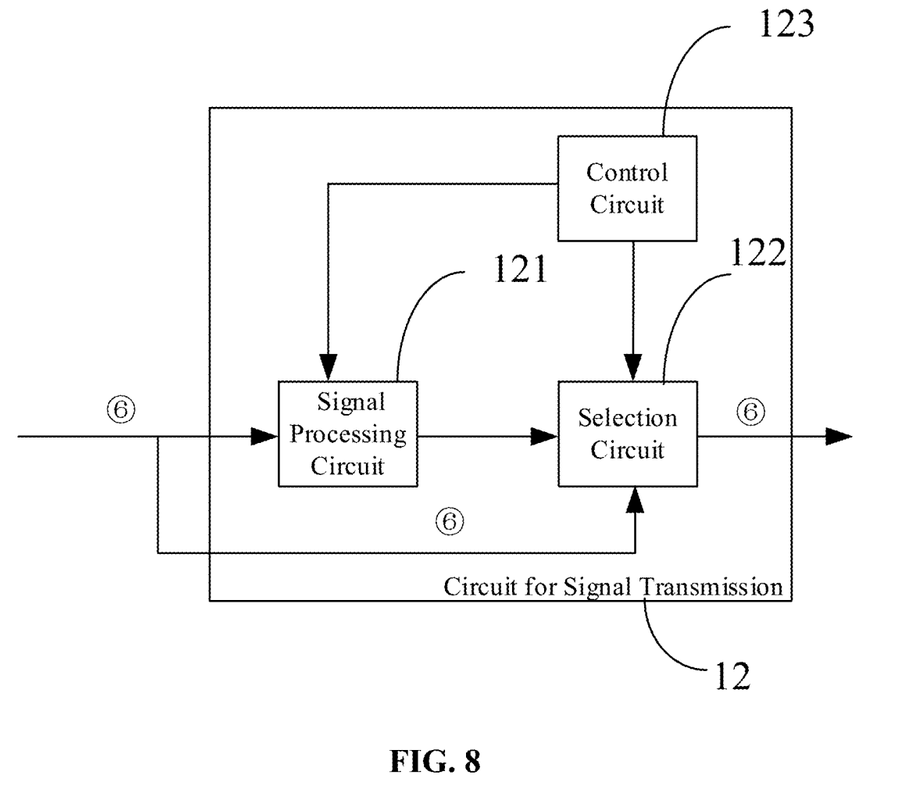
FIG. 8 is a schematic structural diagram of another embodiment of a circuit for signal transmission according to the present disclosure.

Exemplarily, FIG. 7 is a schematic diagram of the waveform of the signal processed by the signal processing circuit according to another embodiment of the present disclosure. FIG. 8 is a schematic structural diagram of the circuit for signal transmission according to another embodiment of the present disclosure. As an example, the circuit 12 for signal transmission illustrated in FIG. 8 receives the signal ⑥ illustrated in FIG. 7. As there is no narrow pulse in the signal ⑥, the control circuit 123 sends the control signal with the second state to the selection circuit 122. The selection circuit 122 selects the signal ⑥ as the output signal of the selection circuit 122 according to the control signal with the second state. Further, in the state as illustrated in FIG. 8, the signal processing circuit 121 may not output the second signal to the selection circuit 122 according to the received control signal.

Figure 9:
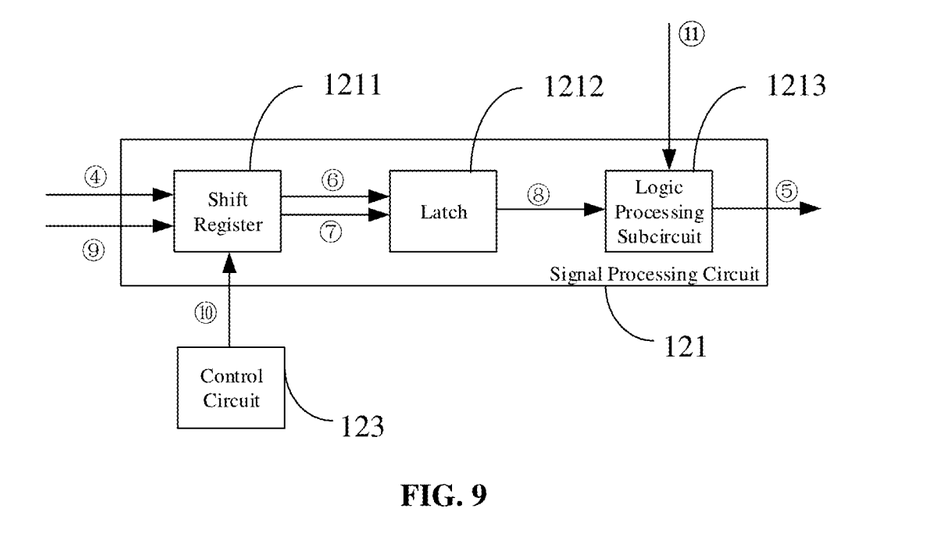
FIG. 9 is a schematic structural diagram of another embodiment of a circuit for signal transmission according to the present disclosure.

In some embodiments, FIG. 9 is a schematic structural diagram of the circuit for signal transmission of another embodiment of the present disclosure. FIG. 9 illustrates a specific implementation of the signal processing circuit 121 in the circuit 12 for signal transmission. The signal processing circuit 121 as illustrated in FIG. 9 specifically includes a shift register 1211, a latch 1212, and a logic processing subcircuit 1213.

Figure 10:
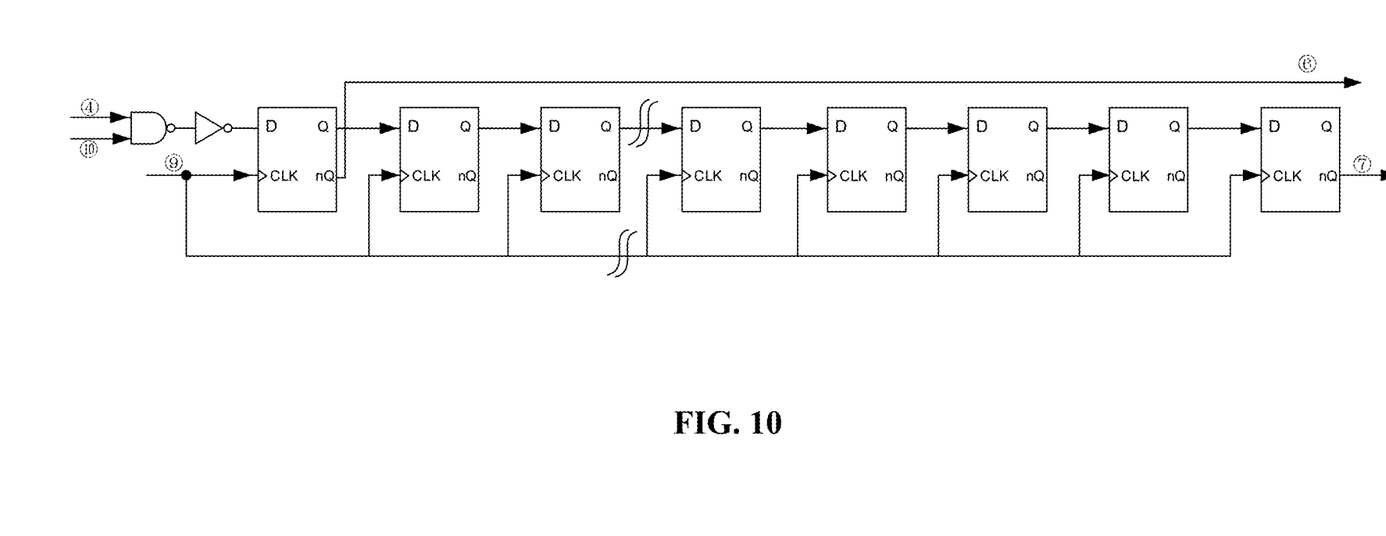
FIG. 10 is a schematic structural diagram of a shift register according to the present disclosure.

The shift register 1211 is configured to receive the first signal and the clock signal, shift the first signal according to the clock cycle of the first signal, and output the shifted first signal to the latch 1212. In some embodiments, FIG. 10 is a schematic structural diagram of a shift register according to the present disclosure. The shift register 1211 illustrated in FIG. 10 specifically includes an N-bit serial shift register. N is the number of first clocks corresponding to a cycle of the first signal. As illustrated in FIG. 10, one block graph represents one shift register. Each input D receives a frontend input signal and a CLK clock signal. Q outputs signal to the next stage. In particular, the input D of the first shift register of the N-bit serial shift register receives the first signal.

In some embodiments, the output end of the N-bit serial shift register not only outputs a second shifted signal by shifting the first signal by N bits to the subsequent latch 1212, but also outputs a first shifted signal by shifting the first signal by M bits to the latch 1212. M is a number of second clocks corresponding to the pulse length of the first signal.

Figure 11:
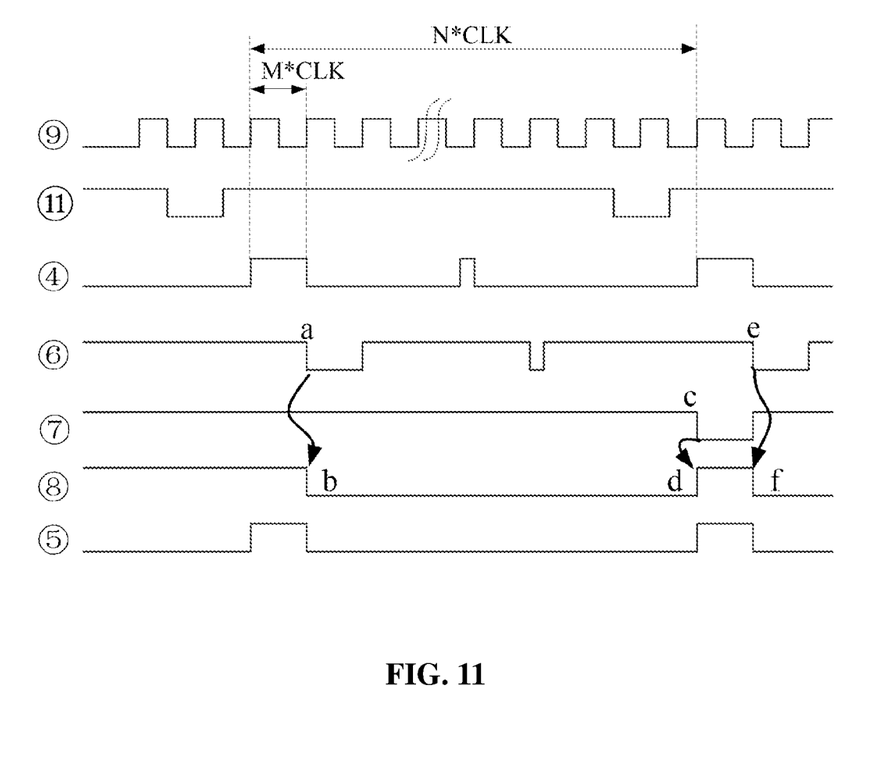
FIG. 11 is a schematic diagram of the waveform of the respective signals transmitted by various units in a circuit for signal transmission according to the present disclosure.

The above process will be described with reference to FIG. 11. FIG. 11 is a schematic diagram of the waveform of the respective signal transmitted by each unit in the circuit for signal transmission according to the present disclosure. The shift register 1211 illustrated in FIG. 9 and FIG. 10 receives the signal ⑨ illustrated in FIG. 11 as a clock signal (CLK) and the signal ④ with a narrow pulse as the first signal. The shift register 1211 further receives the control signal ⑩ (not illustrated in FIG. 11) sent by the control circuit 123. In the example as illustrated in FIG. 11, the length of the first signal ④ is N clocks N*CLK, the length of the effective square wave pulse of the first signal ④ is M clocks M*CLK, and M=1 is taken as an example in FIG. 11.

Referring to FIG. 10 for details, the M=1-th shift register in the shift register 1211 can shift the signal ④, obtain the signal ⑥ as the first shifted signal (denoted as First latch signal or the like), and output the signal ⑥. Since the signal ⑥ is output through the nQ output port of the shift register, the signal ⑥ has an opposite level to the level of the signal ④ and is shifted rearward by one CLK. Meanwhile, the Q output port of the N-th shift register in the shift register 1211 further outputs a second shifted signal (denoted as After shift, or the like). The second shifted signal is the signal ⑦ in FIG. 11. It can be seen that the signal ⑦ is shifted rearward by N CLKs compared with the signal ④.

In some embodiments, the latch specifically includes an edge triggered latch. The edge triggered latch receives the first shifted signal ⑥ and the second shifted signal ⑦ as mentioned above. Specifically, the edge triggered latch generates a signal that the narrow pulse has been removed according to the states of the signal ⑥ and the signal ⑦.

For example, referring to FIG. 11, when the edge triggered latch detects the first edge a of the first shifted signal ⑥ (in the present embodiment, the first edge being a falling edge is taken as an example, and the first edge may be an rising edge), the edge triggered latch outputs a signal with a first level (the first level may be opposite to the pulse level of the first signal, for example, in the present embodiment, the pulse level of the first signal is a high level, and the first level is a low level) through the output end, and keeps latching and outputting the first level until the second edge c of the second shifted signal ⑦ is detected. Subsequently, when the edge triggered latch detects the second edge c of the second shifted signal ⑦ (in the present embodiment, the second edge being the falling edge is taken as an example, and the second edge may be the rising edge), the edge triggered latch outputs the signal with the second level through the output end (the second level may be the same as the pulse level of the first signal, for example, in the present embodiment, the pulse level of the first signal is high level, and the second level is high level), and keeps latching and outputting the second level until the next detection of the first edge e of the first shifted signal ⑥, and so on. Finally, the latch 1212 outputs the signal ⑧ as illustrated in FIG. 11 to the logic processing subcircuit 1213.

The signal ⑤ is obtained by passing the signal ⑧ through the logic processing subcircuit 1213. Also referring to FIG. 9 and FIG. 11, for example, the signal ⑤ is obtained by performing a "logical AND" operation on the signal ⑧ and the signal ④. Then the signal ⑤ finally output by the final logic processing subcircuit 1213 is the second signal after being processed by the entire signal processing circuit 121.

In summary, the circuit for signal transmission provided in the embodiment of the present disclosure can, when the external first signal the is received, process the first signal and output the second signal, which does not include a narrow pulse, to the internal of the memory for processing if there is a narrow pulse in the external signal. When there is no narrow pulse in the external signal, the first signal is directly output to the internal of the memory for processing, thereby eliminating the narrow pulse of the external signal received by the memory, so that the narrow pulse of the external signal will not affect normal processing for the external signal by the memory, and the accuracy of processing the signal by the memory can be improved.

The present disclosure further provides a method for signal transmission. The method may be performed by the circuit 12 for signal transmission in the memory 1 as illustrated in FIG. 3. At this case, the circuit 12 for signal transmission may be understood as a processor by the memory 1, and the method for signal transmission may be performed in a manner of software processing. In particular, the method comprises steps S1 and S2.

At step S1, a control signal and a first signal are acquired. The description of the control signal and the first signal can be referred to the foregoing embodiments of the present disclosure, and will not be elaborated herein.

At step S2, the first signal is output according to the control signal, or a second signal is obtained by processing the first signal in a preset processing manner according to the control signal, and the second signal is output.

In some embodiments, the preset processing manner includes removing a narrow pulse signal between two adjacent pulses in the first signal. For example, a signal between two adjacent pulses in the first signal is set to a low level. More specifically, obtaining the second signal by processing the first signal according to the preset manner includes: obtaining a first shifted signal by shifting the first signal by M bits, M being the number of second clocks corresponding to a pulse length of the first signal; obtaining a second shifted signal by shifting the first signal by N bits, N being the number of first clocks corresponding to a cycle of the first signal; and obtaining the second signal according to a first edge of the first shifted signal and a second edge of the second shifted signal.

In some embodiments, the above process of obtaining the second signal according to the first edge and the second edge specifically includes: obtaining the second signal by outputting, when a first edge of the first shifted signal is detected, a signal with a first level through an output end before a second edge of the second shifted signal is detected, herein the first level is opposite to a level of a pulse signal of the first signal; and obtaining the second signal by outputting, when the second edge of the second shifted signal is detected, a signal with a second level through an output end before the first edge of the first shifted signal is detected, herein the second level is same as the level of the pulse signal level of the first signal. The specific process may be referred to the process as illustrated in FIG. 11, and will not be elaborated herein.

In summary, the method for signal transmission method, the circuit, and the memory provided in the present disclosure can, when the external first signal is received, process the first signal and output the second signal, which does not include a narrow pulse, to the internal of the memory for processing if there is a narrow pulse in the external signal. When there is no narrow pulse in the external signal, the first signal is directly output to the internal of the memory for processing, thereby eliminating the narrow pulse of the external signal received by the memory, so that the narrow pulse of the external signal will not affect normal processing for the external signal by the memory, and the accuracy of processing the signal by the memory can be improved.

Those ordinary skilled in the art will understand that all or part of the steps to implement the above mentioned embodiments of the method may be accomplished by the hardware related to the program instruction. The foregoing program may be stored in a computer readable storage medium. When the program is executed, the steps including the above mentioned embodiments of the method are executed. The foregoing storage medium includes a Read Only Memory (ROM), a RAM, a magnetic disk, an optical disk, or any other medium that can store program codes.

It is to be understood that the above various embodiments are only used to describe the technical solutions of the present disclosure, and are not intended to limit the present disclosure. Although the present disclosure has been described in detail with reference to the foregoing embodiments, those ordinarily skilled in the art should understand that they can still modify the technical solutions described in all the foregoing embodiments, or equivalently replace some or all of the technical features, and these modifications or replacements do not depart the essences of the corresponding technical solutions from the spirit and scope of the technical solutions of all the embodiments of the present disclosure.

The inventioin claimed is:

1. A circuit for signal transmission, comprising:
a signal processing circuit, configured to receive an input first signal, obtain a second signal by processing the first signal in a preset processing manner, and take the second signal as an output signal of the signal processing circuit;
a multiplexer, connected to the signal processing circuit, and configured to receive the input first signal, the second signal and a control signal, and take the first signal or the second signal as an output signal of the multiplexer according to the control signal; and
a control circuit, connected to the multiplexer, and is configured to send the control signal to the multiplexer;
wherein the signal processing circuit is further configured to receive the control signal;
the signal processing circuit is configured to obtain the second signal by processing the first signal in the preset processing manner when the control signal corresponds to a first state; and
the signal processing circuit is configured to set the second signal to a fixed value when the control signal corresponds to a second state;
wherein the preset processing manner comprises: setting a noise/glitch between two adjacent pulses in the first signal to a low level when the first signal is a pulse signal; and
wherein the signal processing circuit comprises:
a shift register, configured to shift the first signal according to a clock cycle of the first signal and output a shifted first signal to a latch;
the latch, configured to latch the shifted first signal and output the latched received signal to a logic processing subcircuit; and
the logic processing subcircuit, configured to output the second signal according to the shifted first signal.

2. The circuit of claim 1, wherein the shift register comprises:
an N-bit serial shift register, wherein N is a number of clocks the first signal is shifted by the first shift register corresponding to a cycle of the first signal, and
wherein an input end of the N-bit serial shift register is configured to receive the first signal;
a first shift register of the N-bit serial shift register is configured to output a first shifted first signal, wherein the first shifted first signal is obtained by M bits shift to the first signal, wherein M is a number of clocks the first signal is shifted by the first shift register corresponding to a pulse width of the first signal; and
an output end of the N bit serial shift register is configured to output a second shifted first signal, which has been shifted by N bits, to the latch.

3. The circuit of claim 2, wherein
the latch comprises an edge triggered latch; and
the edge triggered latch has a first input end for receiving the first shifted first signal, a second input end for receiving the second shifted first signal, and an output end for outputting a signal, which has been latched, to the logic processing subcircuit.

4. The circuit of claim 3, wherein the edge triggered latch is configured to:
output, when a first edge of the first shifted first signal is detected, a signal with a first level through an output end before a second edge of the second shifted first signal is detected; and
output, when the second edge of the second shifted first signal is detected, a signal with a second level through the output end before the first edge of the first shifted first signal is detected.

5. The circuit of claim 4, wherein
the first level is opposite to a level of a pulse signal of the first signal; and
the second level is a same level as the level of the pulse signal of the first signal.

6. The circuit of claim 1, wherein the circuit for signal transmission is applied to a memory to receive a first signal from external, wherein the memory comprises the circuit for signal transmission, and the control circuit is configured to:
send a control signal corresponding to a first state to the multiplexer when the memory is in a test state; and
send a control signal corresponding to a second state to the multiplexer when the memory is in a normal operating state.

* * * * *